(12) United States Patent
Boon et al.

(10) Patent No.: US 7,112,471 B2
(45) Date of Patent: Sep. 26, 2006

(54) LEADLESS PACKAGING FOR IMAGE SENSOR DEVICES AND METHODS OF ASSEMBLY

(75) Inventors: Suan Jeung Boon, Singapore (SG); Yong Poo Chia, Singapore (SG); Yong Loo Neo, Singapore (SG); Swee Kwang Chua, Singapore (SG); Siu Waf Low, Singapore (SG)

(73) Assignee: Micron Technology, Inc., Boise, ID (US)

( * ) Notice: Subject to any disclaimer, the term of this patent is extended or adjusted under 35 U.S.C. 154(b) by 146 days.

(21) Appl. No.: 10/693,376

(22) Filed: Oct. 23, 2003

(65) Prior Publication Data

US 2004/0084741 A1  May 6, 2004

Related U.S. Application Data

(62) Division of application No. 10/233,319, filed on Aug. 28, 2002.

(51) Int. Cl.
 H01L 21/44 (2006.01)
 H01L 21/48 (2006.01)
 H01L 21/50 (2006.01)

(52) U.S. Cl. ......................... 438/116; 438/64
(58) Field of Classification Search ............... 257/431, 257/432, 433, 434; 438/64, 116
See application file for complete search history.

(56) References Cited

U.S. PATENT DOCUMENTS

| | | | |
|---|---|---|---|
| 5,357,056 A | 10/1994 | Nagano | |
| 5,477,081 A | 12/1995 | Nagayoshi | |
| 5,675,474 A | 10/1997 | Nagase et al. | |
| 5,687,474 A | 11/1997 | Hamzehdoost et al. | |
| 5,699,073 A | * 12/1997 | Lebby et al. | .................. 345/82 |
| 5,702,985 A | 12/1997 | Burns | |
| 5,865,935 A | 2/1999 | Ozimek et al. | |
| 5,867,368 A | 2/1999 | Glenn | |
| 6,147,389 A | 11/2000 | Stern et al. | |
| 6,351,027 B1 | 2/2002 | Bigoney et al. | |
| 6,384,473 B1 | 5/2002 | Peterson et al. | |
| 6,404,648 B1 | 6/2002 | Slupe et al. | |
| 6,433,332 B1 * | 8/2002 | Chin et al. | .................. 250/239 |
| 6,455,927 B1 * | 9/2002 | Glenn et al. | ................. 257/686 |
| 6,531,341 B1 | 3/2003 | Peterson et al. | |
| 6,649,991 B1 | 11/2003 | Chen et al. | |
| 6,686,588 B1 | 2/2004 | Webster et al. | |
| 6,703,598 B1 * | 3/2004 | Muramatsu et al. | ...... 250/214.1 |
| 6,713,876 B1 | 3/2004 | Vittu et al. | |
| 6,798,031 B1 * | 9/2004 | Honda et al. | ................ 257/433 |

(Continued)

Primary Examiner—Hoai Pham
Assistant Examiner—Mursalin B. Hafiz
(74) Attorney, Agent, or Firm—TraskBritt

(57) ABSTRACT

A leadless image sensor package and methods for its assembly. In a first embodiment, an image sensor chip is mounted within a bottom-side cavity of a package shell in a flip-chip manner such that sensing circuitry on the image sensor chip is exposed through an aperture in the top side of the package shell. A transparent encapsulant material is deposited within the aperture to encase interconnect bonds between the package shell and the image sensor chip. A transparent lid is held in place over the aperture by the encapsulant material. The back surface of the image sensor chip is left exposed. In a second embodiment particularly suitable for high-end image sensors, an encapsulant material is not required. Instead, a backing cap is hermetically sealed to a ledge surface in the package shell to cover the bottom-side cavity. A compression member formed on the backing cap contacts the image sensor chip and maintains interconnect bond integrity.

26 Claims, 11 Drawing Sheets

U.S. PATENT DOCUMENTS

| | | |
|---|---|---|
| 6,861,737 B1 | 3/2005 | Jeong et al. |
| 6,885,107 B1 * | 4/2005 | Kinsman .................. 257/778 |
| 2002/0024131 A1 | 2/2002 | Sasano |
| 2002/0043706 A1 | 4/2002 | Jerominek et al. |
| 2002/0089044 A1 | 7/2002 | Simmons et al. |
| 2003/0056967 A1 | 3/2003 | Glenn et al. |
| 2003/0111441 A1 | 6/2003 | Jerominek et al. |
| 2003/0197285 A1 | 10/2003 | Strandberg et al. |
| 2004/0038442 A1 * | 2/2004 | Kinsman .................. 438/64 |
| 2004/0212055 A1 | 10/2004 | Exposito et al. |
| 2004/0217454 A1 | 11/2004 | Brechignav et al. |

* cited by examiner

LEADLESS PACKAGING FOR IMAGE SENSOR DEVICES AND METHODS OF ASSEMBLY

CROSS-REFERENCE TO RELATED APPLICATION

This application is a divisional of application Ser. No. 10/233,319, filed Aug. 28, 2002, pending.

BACKGROUND OF THE INVENTION

1. Field of the Invention

The present invention relates to packaging of optically interactive microelectronic devices. More particularly, the present invention relates to a leadless package for a solid-state image sensor and methods for its assembly.

2. State of the Art

Optically interactive microelectronic devices, for example, charge coupled device (CCD) image sensors or complementary metal-oxide semiconductor (CMOS) image sensors, require packaging that provides protection from environmental conditions while allowing light or other forms of radiation to pass through to a surface where sensing circuitry is located. Typically, this has been accomplished by placing a sensor device in the form of a semiconductor die into a cavity of a plastic or ceramic housing, wire bonding electrical connection points on the semiconductor die to conductive elements associated with the housing and placing a window or transparent lid over the cavity. This packaging arrangement can require several fabrication steps and raises concerns of durability and size. Wire bonds, for instance, involve special considerations during package formation due to the fragile nature of the thin wires and bond connections, and also call for increased package size in order to accommodate the arched wire bonds within the package cavity. Further, the housing construction for such a package requires a large volume of material held within tight tolerances, increasing cost and production time. The completed sensor package is large and takes up valuable space in high-density circuit assemblies.

In order to reduce size and increase durability, various methods have been developed in an attempt to make improvements over this packaging method. U.S. Pat. No. 5,867,368 to Glenn and U.S. Pat. No. 5,357,056 to Nagano, for example, disclose packages for optically interactive devices wherein flip-chip attachment is used instead of wire bonding for more durable connections and increased device performance. U.S. Pat. No. 6,351,027 to Giboney et al. discloses a chip-mounted enclosure wherein a sidewall piece is mounted directly to a semiconductor die to surround sensing or light-emitting circuitry and a transparent cover is attached over the sidewall piece. U.S. Pat. No. 6,384,473 to Peterson et al. discloses a stacked-plate packaging structure with an integral window that reduces fabrication steps and improves the sealing properties of the package. U.S. Pat. No. 6,147,389 to Stem et al. discloses an image sensor package with a stand-off frame for a window and reference plane members for simple and accurate mounting of an image sensor within the package. While these and other designs offer some packaging improvements, they still raise issues regarding numerous housing elements requiring multiple steps of assembly and difficulties with hermetically sealing the packages. Further, the incorporation of these structures into larger circuit assemblies often involves the use of delicate leads or solder pad arrangements which are not suitable for today's high-speed automated assembly techniques.

Accordingly, a need exists for improved packaging of image sensors or other optically interactive microelectronic devices that is simple to fabricate and assemble while being of durable and cost-sensitive construction.

BRIEF SUMMARY OF THE INVENTION

In contrast to the above-described prior art, the present invention provides a method and apparatus for packaging an optically interactive microelectronic device such as an image sensor within a leadless shell having a bottom-side cavity. The image sensor, in the form of a semiconductor die or chip, is mounted to conductive elements within the cavity in a flip-chip configuration such that the active die surface containing sensing circuitry is exposed through an aperture in the top surface of the shell. A transparent lid is placed over the aperture to protect the active surface from environmental conditions and may also provide an optical function such as, for example, focusing or filtering light passing therethrough. A plurality of castellated solder pads in electrical communication with the conductive elements is formed around the periphery of the shell and extends to the bottom side of the shell for attachment of the image sensor package to a carrier substrate such as a printed circuit board (PCB) or other higher-level packaging.

While exemplary embodiments are described herein in terms of an image sensor, it is to be understood that the present invention may be used for packaging various other optically interactive devices which require a window for access to a device surface. The term "optically interactive" as used herein is meant to encompass devices sensitive to various wavelengths of light or other forms of radiation, such as, but not limited to, CCD and CMOS image sensors, EPROM's, and photodiodes, as well as light-emitting devices including semiconductor lasers and light-emitting diodes.

In one exemplary embodiment of the present invention, an image sensor chip is flip-chip mounted to the shell with gold-gold interconnect bonding and the active surface of the chip is buried in a transparent encapsulant which serves to bond the chip onto the package casing, maintain bond integrity and protect the chip edges. The encapsulant is subsequently capped with a transparent lid held in place by adhesion to the encapsulant material. The back of the image sensor chip is left exposed within the bottom-side cavity of the shell.

In another exemplary embodiment of the present invention, the shell is prefabricated with a transparent lid mounted over the aperture of the shell. Gold-gold interconnect bonding is still used to mount the image sensor package in a flip-chip fashion, but the use of adhesive and encapsulant material is kept to a minimum. A backing cap is placed over the back of the image sensor chip within the bottom-side cavity to hermetically seal the package and protect the image sensor chip.

Other and further features and advantages will be apparent from the following descriptions of the various embodiments of the present invention when read in conjunction with the accompanying drawings. It will be understood by one of ordinary skill in the art that the following is provided for illustrative and exemplary purposes only, and that numerous combinations of the elements of the various embodiments of the present invention are contemplated as being within the scope of the present invention.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Referring in general to the accompanying drawings, various aspects of the present invention are illustrated to show the structure and methods for assembly of a leadless package containing an exemplary solid-state image sensor. Common elements of the illustrated embodiments are designated with like numerals. It should be understood that the figures presented are not meant to be illustrative of actual views of any particular portion of the actual device structure, but are merely idealized schematic representations which are employed to more clearly and fully depict the invention. It should further be understood that while depicted and described in the context of an image sensor, the package embodiments and methods presented herein would work well for enclosing other types of optically interactive devices as described above.

Figure 1:
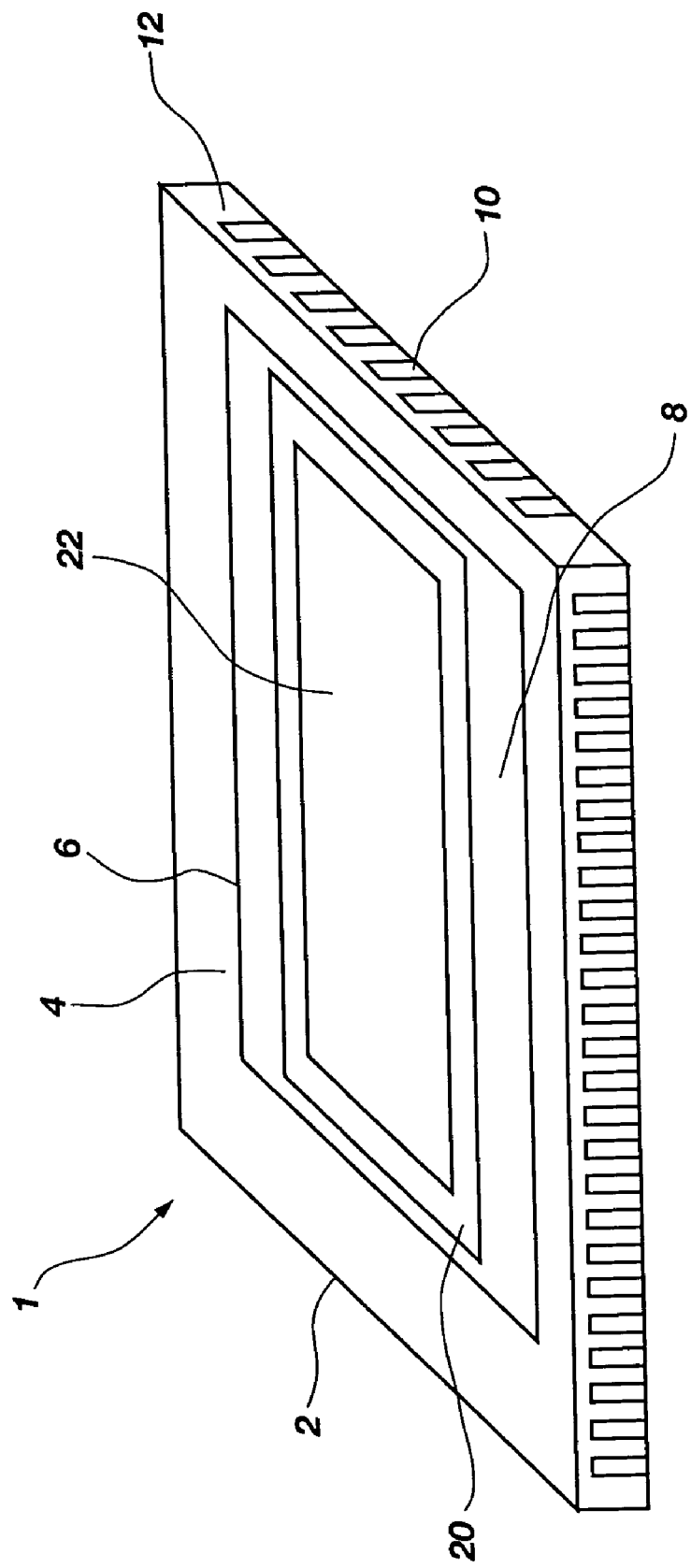
FIG. 1 is a perspective top view of an image sensor package according to the present invention showing a transparent window mounted on the top surface of a package shell and the active surface of an image sensor chip exposed therethrough.

FIG. 1 is a perspective top view of a leadless image sensor package 1 of the present invention showing features which are common to the various embodiments of the invention. A package shell 2 includes a top surface 4 having an aperture 6 extending downwardly through package shell 2. While it is presently preferred that package shell 2 be constructed of a ceramic material, other materials such as molded plastic could also be used if capable of maintaining package tolerances and providing sufficient insulation from environmental conditions. The hermetic properties of a ceramic shell are particularly suited to the second embodiment of the present invention which is described in detail below. A transparent lid 8 covers aperture 6. The term "transparent" is used broadly herein to include materials that allow the passage of visible light or other forms of radiation having a selected wavelength such as infrared or ultraviolet. Example materials for transparent lid 8 are plates of borosilicate or quartz glass; however, other glass, ceramic or plastic materials having suitable transmissivity are within the scope of the present invention. A plurality of castellated solder pads 10 is formed around the periphery of package shell 2, extending from a lower portion of shell side surfaces 12 onto the bottom surface 14 of the package shell 2 (FIG. 2) for mechanical attachment and electrical coupling of the image sensor package 1 to a carrier substrate such as a printed circuit board (PCB). This castellated solder pad arrangement is well suited for attachment of image sensor package 1 to a carrier substrate 100 using conventional automated assembly equipment. As can be seen in FIG. 3, solder pads 10 provide conductive bonds between image sensor package 1 and conductive elements 102 on carrier substrate 100 which may be easily inspected, and reworked and repaired if necessary. Solder pads 10 may be bonded to conductive elements 102 using reflowed tin/lead or silver solder, conductive or conductor-filled epoxy or other conductive bonding agents 104 which are well known in the art.

Figure 2:
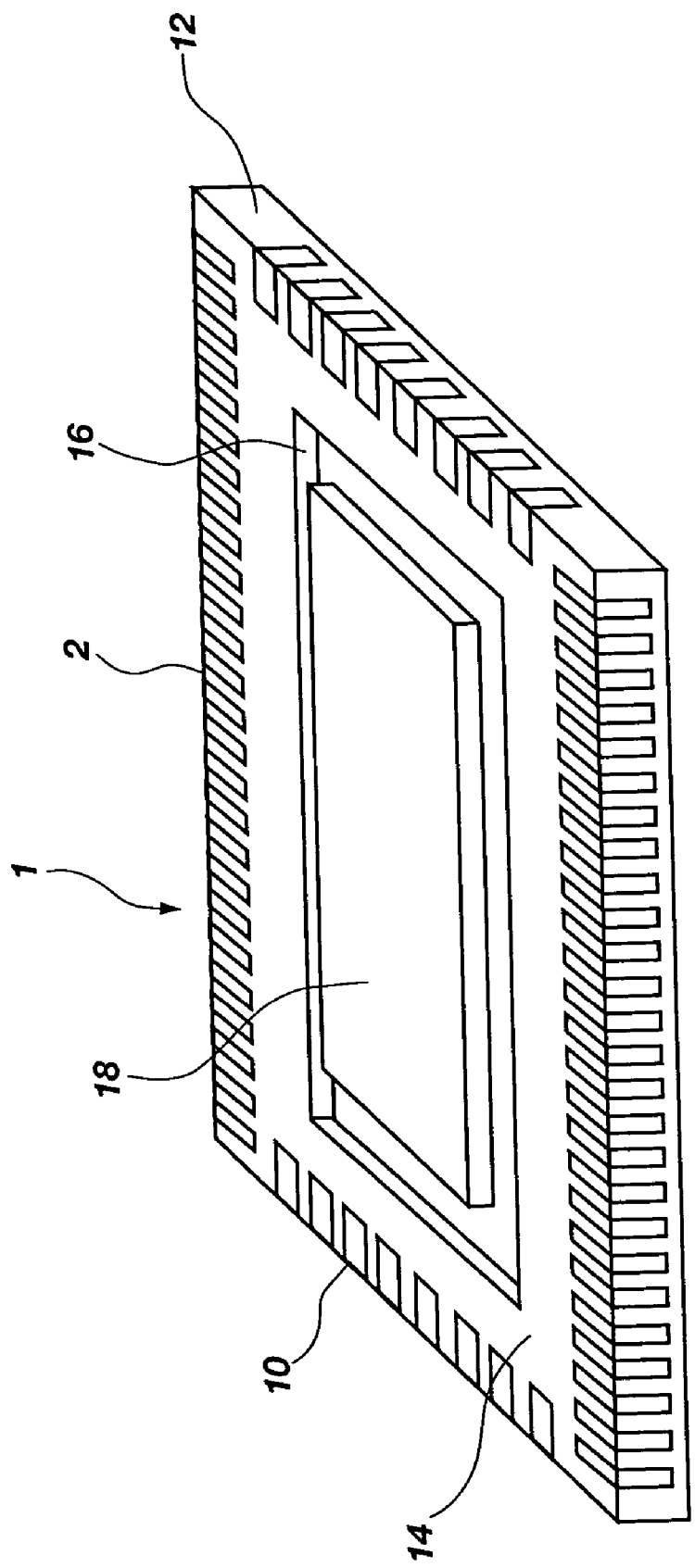
FIG. 2 is a perspective bottom view of the image sensor package of FIG. 1 showing a bottom-side cavity formed in the bottom surface of the package shell and containing the image sensor package.
Figure 3:
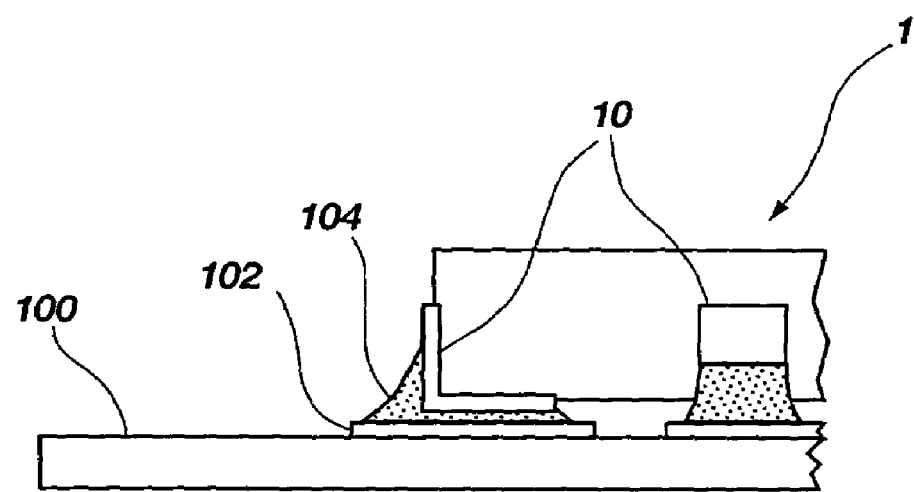
FIG. 3 is a partial side view of an image sensor package according to the present invention mounted to a carrier substrate.

FIG. 2 is a perspective bottom view of the leadless image sensor package 1 showing further features common to the embodiments of the invention. A bottom-side cavity 16 is formed in bottom surface 14 of package shell 2 and is in communication with aperture 6. An image sensor chip 18 is flip-chip mounted within bottom-side cavity 16 in a face-up manner such that at least a portion of its active surface 20 (FIG. 1) containing sensing circuitry is exposed through aperture 6. By this arrangement, active surface 20 of image sensor chip 18 may receive light or other forms of radiation passed through transparent lid 8.

Turning to FIGS. 4 and 5A through 5G, a first exemplary embodiment of the present invention and method of assembly thereof is illustrated.

Figure 4:
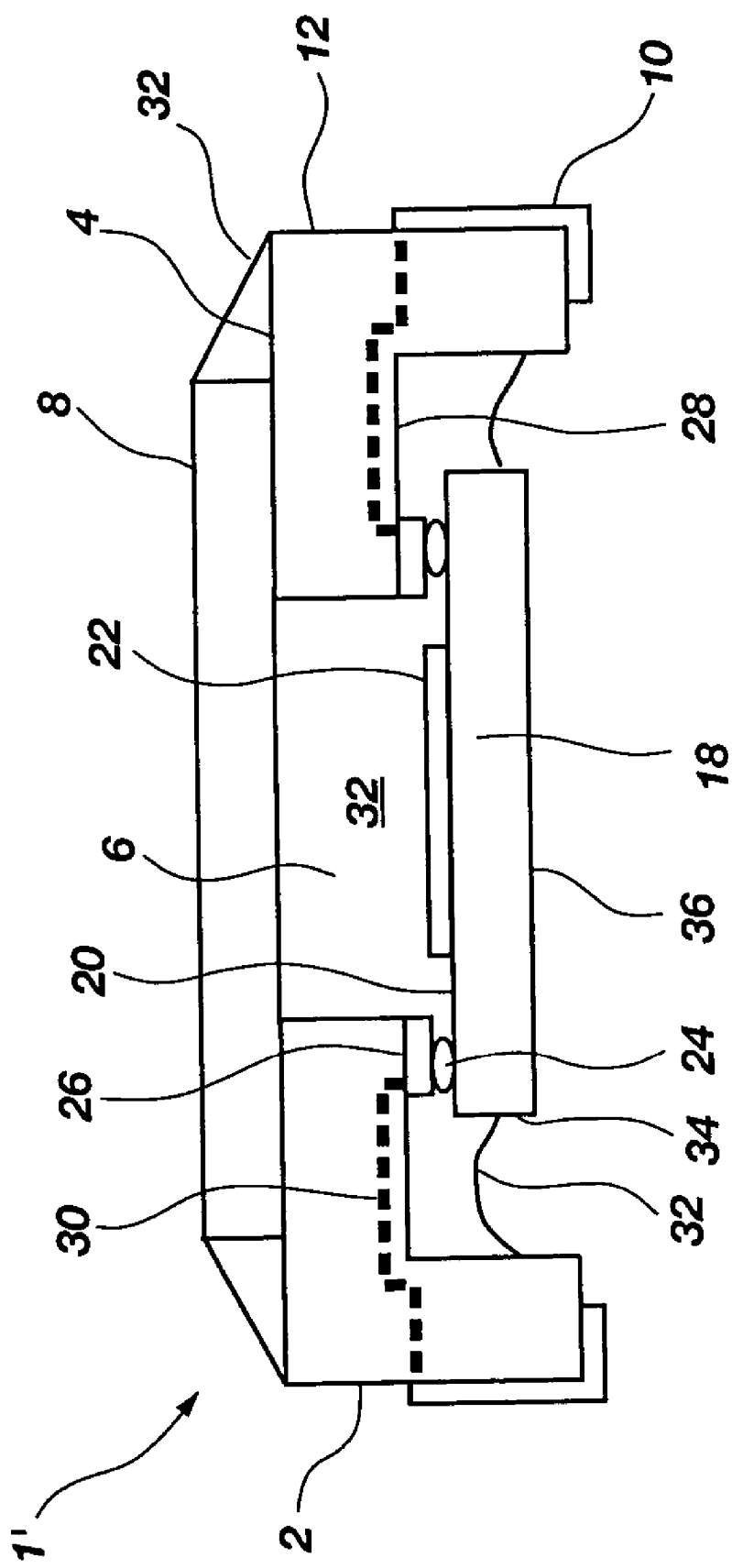
FIG. 4 is a sectional side view of a first embodiment of an image sensor package according to the present invention wherein a transparent window is mounted in an encapsulant covering the active surface of an image sensor chip.

FIG. 4 shows a sectional side view of an image sensor package 1' including image sensor chip 18 mounted to package shell 2 in a flip-chip fashion such that active surface 20 faces aperture 6. As seen in FIG. 4, active surface 20 may optionally include pixeled microlenses 22 which cover the sensing circuitry thereon to focus light or provide other optical functions. Image sensor chip 18 is mounted by attaching conductive bumps 24 disposed on bond pads or redistributed bond pads (not shown) on active surface 20 to terminal pads 26 formed on the top surface 28 of bottom-side cavity 16 and surrounding aperture 6. Conductive bumps 24 and terminal pads 26 are formed of, or plated with, gold that is joined to provide the presently preferred gold-gold interconnect bonding. The gold-gold connection is desirable for providing a highly conductive interface with image sensor chip 18; however, other materials such as bumps of tin/lead solder, silver solder or conductive or conductor-filled epoxy may be used as well. Terminal pads 26 are electrically connected to solder pads 10 via conductive lines or traces 30 buried within the ceramic material of package shell 2.

An encapsulant material 32 fills aperture 6, covering active surface 20 and pixeled microlenses 22. Encapsulant 32 serves to bond image sensor chip 18 to package shell 2, maintain bond integrity between conductive bumps 24 and terminal pads 26, and to protect the sides 34 of image sensor chip 18. Encapsulant 32 extends up to the top of aperture 6 where transparent lid 8 is mounted on top surface 4 of package shell 2 to cover aperture 6. A layer of encapsulant 32 further extends under and around the edges of transparent lid 8 to adhesively bond it in place on top surface 4. Encapsulant 32 may be a clear epoxy or other resin-type material like polymethylmethacrylate, polycarbonate or silicone, as long as it is suitably transmissive of light or other forms of radiation specific to the operation of image sensor chip 18 and is capable of adhesively bonding transparent lid 8. As indicated by FIG. 4, the sides 34 of image sensor chip 18 are partially encased in encapsulant 32 while the back 36 of image sensor chip 18 is left exposed. This encapsulation arrangement is acceptable for image sensor devices not likely to be subjected to extreme environmental conditions, and results in a simple and cost-effective package.

Figure 5G:
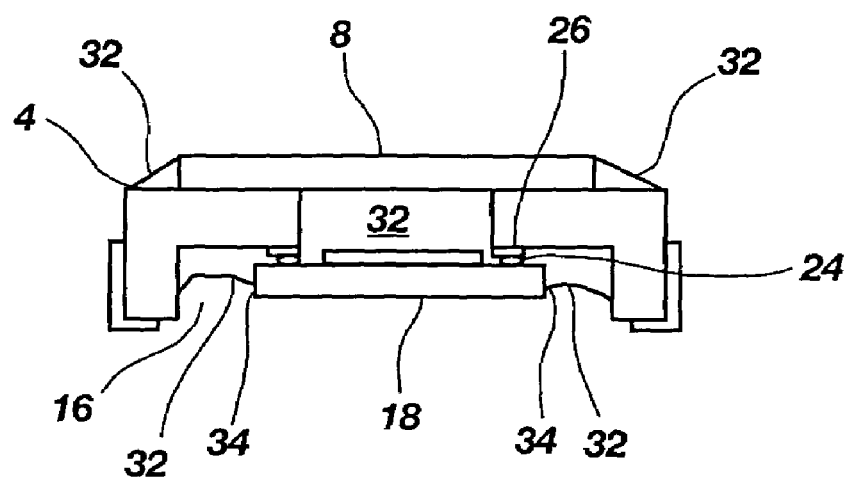
FIGS. 5A through 5H are views showing a method of assembly for the first embodiment of an image sensor package depicted in FIG. 4.
Figure 5A:
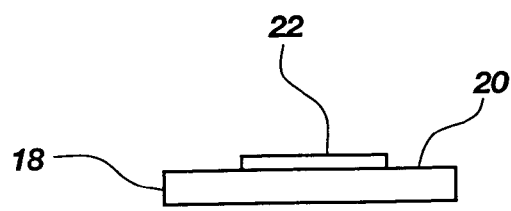
Figure 5B:
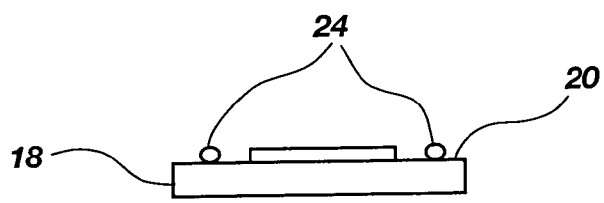
Figure 5C:
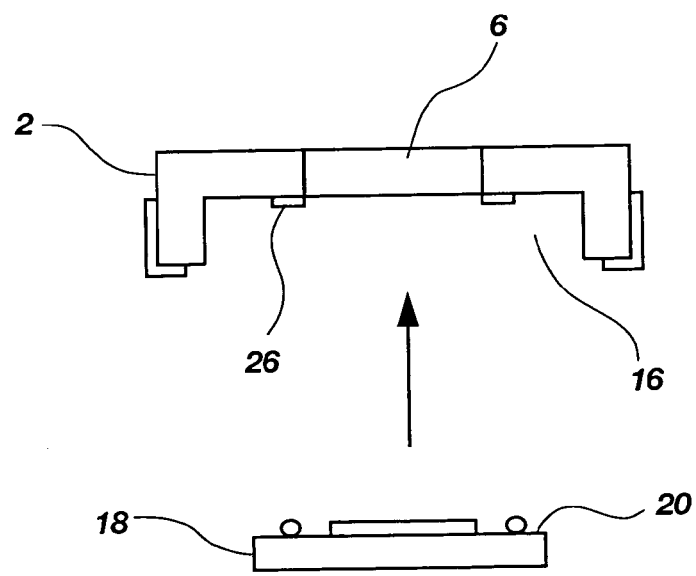
Figure 5D:
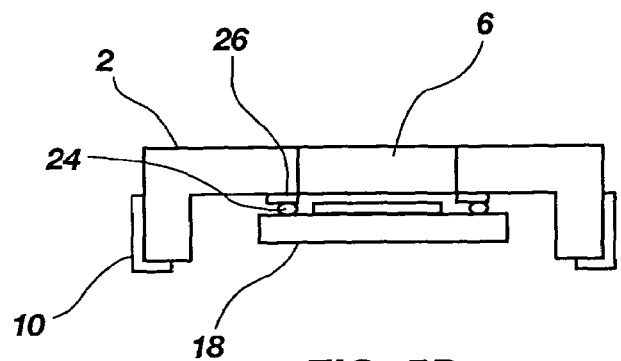
Figure 5E:
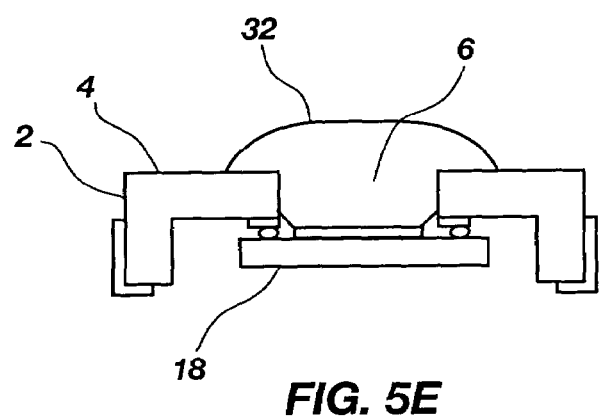
Figure 5F:
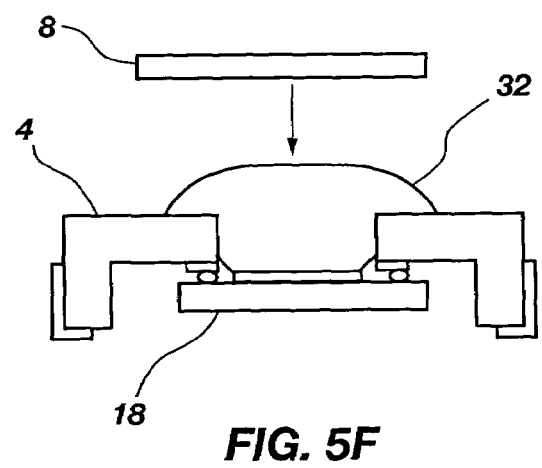

FIGS. 5A through 5G show a method of assembly for the first exemplary embodiment of the present invention. FIG. 5A shows an image sensor chip 18 having pixeled microlenses 22 on active surface 20. In FIG. 5B, gold or gold-plated conductive bumps 24 are formed on active surface 20 for subsequently effecting gold-gold interconnect bonding. Image sensor chip 18 is placed in bottom-side cavity 16 of package shell 2 with active surface 20 facing aperture 6, as illustrated by FIG. 5C. In FIG. 5D, conductive bumps 24 are bonded to terminal pads 26 using known bonding techniques, effectively mounting image sensor chip 18 within package shell 2 and providing electrical connection of image sensor chip 18 to solder pads 10 through conductive lines or traces 30 (FIG. 4). Next, FIG. 5E shows encapsulant 32 deposited within aperture 6 and over a central portion of the top surface 4 of package shell 2. In FIG. 5F, transparent lid 8 is lowered onto the top of encapsulant 32 and gradually squeezed into contact with top surface 4, as illustrated in FIG. 5G. As can be seen in FIG. 5G, when transparent lid 8 is squeezed into place, it forces encapsulant 32 through spaces between the bonded conductive bumps 24 and terminal pads 26 and out into bottom-side cavity 16 to partially encase the sides 34 of image sensor chip 18. Encapsulant 32 is also forced out around the edges of transparent lid 8 to further hold it in place on top surface 4. Encapsulant 32 is then allowed to cure or, in the case of an activated adhesive material, may be set using UV radiation, thermal, chemical or other appropriate curing processes. At this point, image sensor package 1' is completely assembled and ready for attachment to carrier substrate 100.

Figure 5H:
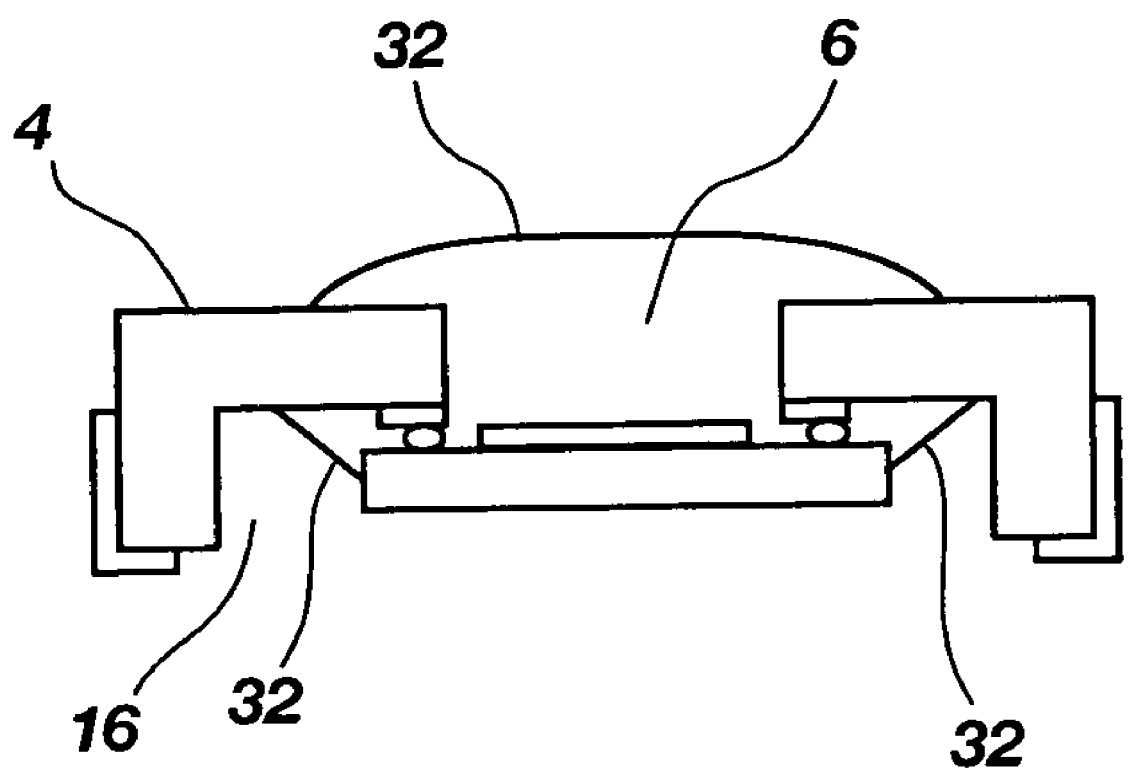

In situations where the above-described method of assembly is carried out with a low-viscosity encapsulant, it may be desirable to allow encapsulant 32 to flow through to bottom-side cavity 16 by virtue of capillary action rather than forcing it down with transparent lid 8. FIG. 5H, which corresponds to the actions taken in FIG. 5E, shows this alternative to the method. As in FIG. 5E, encapsulant 32 is deposited within aperture 6 and over a central portion of the top surface 4 of package shell 2. FIG. 5H shows the process is then paused for a period of time to allow encapsulant 32 to flow into bottom-side cavity 16 by capillary action prior to the placement of transparent lid 8. After the flow of encapsulant 32 has reached equilibrium, the placement of transparent lid 8 depicted in FIG. 5F is conducted in the same manner as before.

For certain high-end image sensor devices, placing encapsulant over the sensing circuitry may interfere with optimal image sensing. Further, in the case of extreme environmental conditions, or for image sensors that are particularly sensitive to moisture, the above-described encapsulant arrangement may not offer sufficient protection. Turning to FIGS. 6 and 7A through 7H, a second exemplary embodiment of the present invention that addresses these issues is illustrated.

Figure 6:
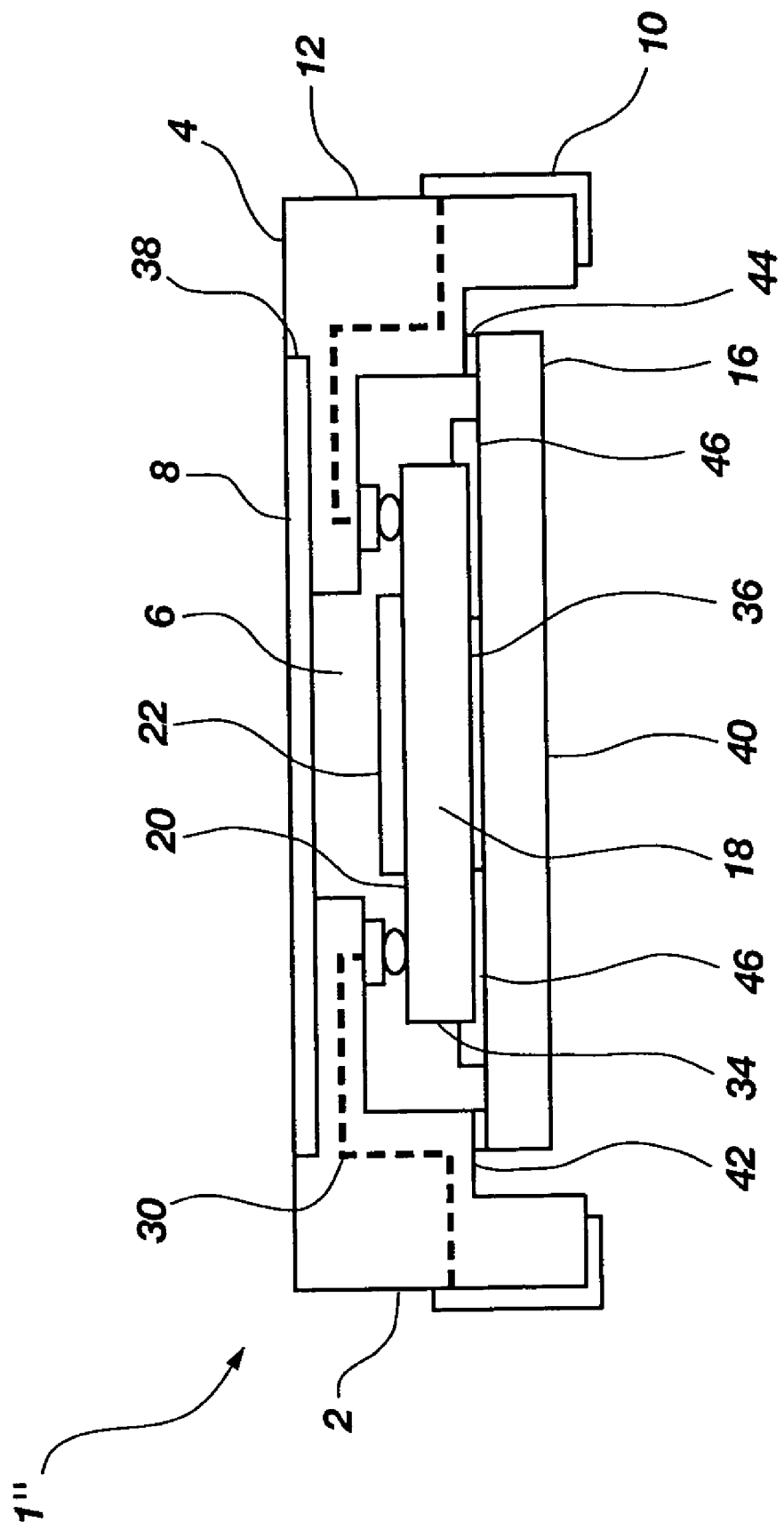
FIG. 6 is a sectional side view of a second embodiment of an image sensor package according to the present invention wherein a package shell is prefabricated with a transparent lid and a backing cap is placed over a back-side cavity to hermetically seal the image sensor package.

FIG. 6 shows a sectional side view of an image sensor package 1" wherein package shell 2 is prefabricated with transparent lid 8 in place. A depression or recess 38 may be formed in top surface 4 of package shell 2 to seat transparent lid 8. If transparent lid 8 is a glass or ceramic material, it may be integrally formed with the presently preferred ceramic material of package shell 2 during a ceramic firing process. This approach provides a unitary component with a hermetically sealed top surface 4. Various adhesives may also be used to attach transparent lid 8 to package shell 2 as long as they supply a strong, hermetic bond without significantly impinging into aperture 6. Image sensor chip 18 is still mounted to package shell 2 by flip-chip bonding of conductive bumps 24 and terminal pads 26, but an encapsulant material is not deposited within aperture 6 to cover active surface 20 due to the optical requirements of image sensor chip 18. Mechanical integrity and sealing of image sensor chip 18 is instead maintained by the hermetic seal between transparent lid 8 and package shell 2 formed during prefabrication and by a backing cap 40, which will be described in detail below. Castillated solder pads 10 have the same configuration as those of the first embodiment and are similarly electrically connected to the interconnect bonds via conductive lines or traces 30 buried within the material of package shell 2.

As can be seen in FIG. 6, a ceramic backing cap 40 is placed over bottom-side cavity 16 to cover the sides 34 and back 36 of image sensor chip 18. Backing cap 40 is seated on a peripheral ledge surface 42 formed in bottom surface 14 of package shell 2 around the periphery of bottom-side cavity 16. A bead of epoxy or other adhesive material 44 may be used to hold backing cap 40 in place and hermetically seal the assembly. Compression member 46 is formed on backing cap 40 and makes contact with the perimeter of back 36 of image sensor chip 18. By providing force to the back 36 of image sensor chip 18, compression member 46 helps to maintain mechanical integrity of the interconnect bond between conductive bumps 24 and terminal pads 26 and adds a cushion between backing cap 40 and image sensor chip 18. This is helpful in situations where image sensor package 1" is subjected to mechanical shock or vibration conditions that would otherwise damage the interconnect bond. In the present exemplary embodiment, compression member 46 is a soft gold trace formed on backing cap 40; however, other materials having similar compressive and sealing properties are within the scope of the invention. Further, while compression member 46 is depicted as contacting only the perimeter of back 36 of image sensor chip 18, other arrangements such as configuring compression member 46 to contact the entire back 36 are possible.

Figure 7A:
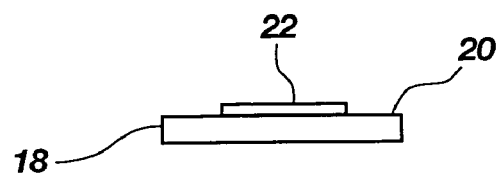
FIGS. 7A through 7H are views showing a method of assembly for the second embodiment of an image sensor package depicted in FIG. 6.
Figure 7B:
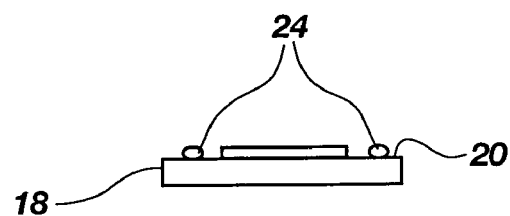
Figure 7C:
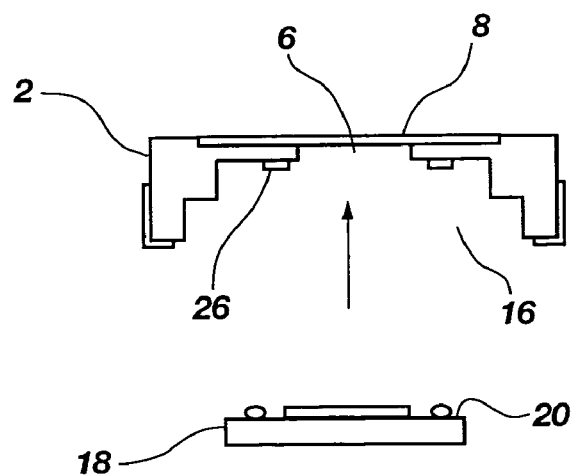
Figure 7D:
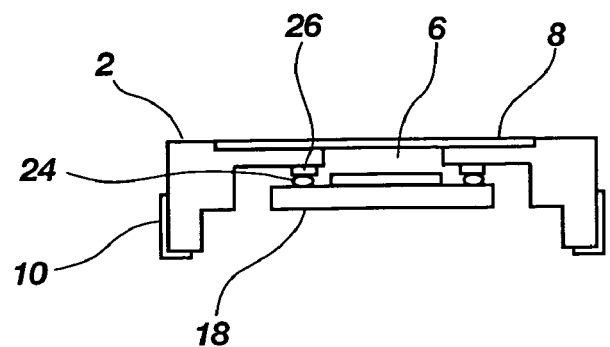
Figure 7E:
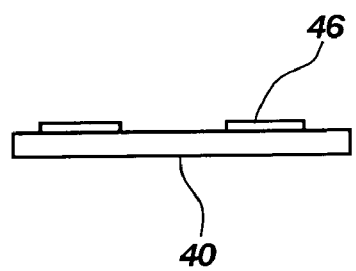
Figure 7F:
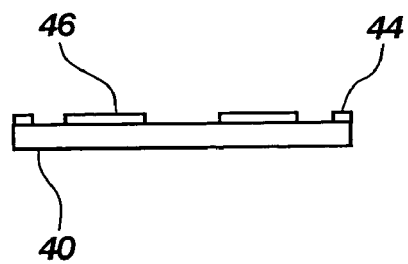
Figure 7G:
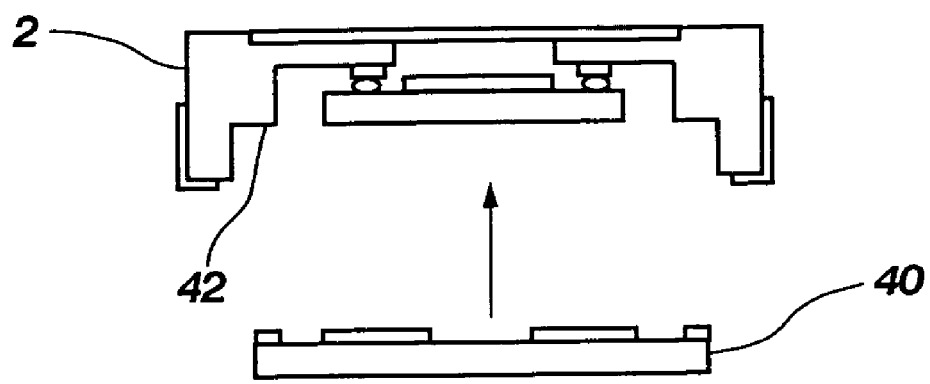
Figure 7H:
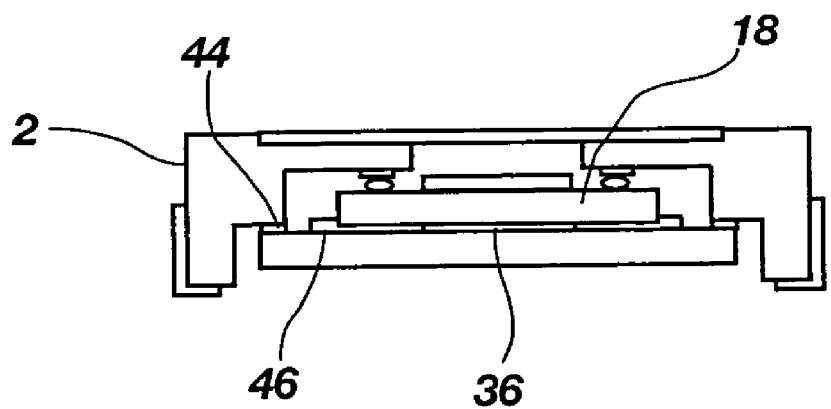

FIGS. 7A through 7H show a method of assembly for the second exemplary embodiment of the present invention. FIG. 7A shows an image sensor chip 18 having pixeled microlenses 22 on active surface 20, and FIG. 7B shows the formation of gold or gold-plated conductive bumps 24 thereon for effecting gold-gold interconnect bonding as in the first image sensor package embodiment. Image sensor chip 18 is placed in bottom-side cavity 16 of package shell 2 with active surface 20 facing aperture 6, as illustrated by FIG. 7C. As previously described, in this embodiment of the present invention, package shell 2 has been prefabricated with transparent lid 8 already in place, providing a strong, hermetic seal that does not require a subsequent deposition of encapsulant material. In FIG. 7D, conductive bumps 24 are bonded to terminal pads 26, mounting image sensor chip 18 within package shell 2 and providing electrical connection of image sensor chip 18 to solder pads 10 through conductive lines or traces 30 (FIG. 6). The assembly is now ready to be sealed with backing cap 40. FIG. 7E shows backing cap 40 with compression member 46 formed thereon. In FIG. 7F, a bead of epoxy or other adhesive material 44 is dispensed around the perimeter of backing cap 40. Backing cap 40 is then pressed into contact with peripheral ledge surface 42 and compression member 46 is deformably compressed by the back 36 of image sensor chip 18, as illustrated by FIGS. 7G and 7H. The epoxy or other adhesive material 44 is then cured to hermetically bond backing cap 40 to peripheral ledge surface 42 and hold compression member 46 against the back 36 of image sensor chip 18. Image sensor chip 18 is hermetically sealed within image sensor package 1", which is now ready for attachment to carrier substrate 100.

It is also within the scope of the present invention that certain aspects of one of the described embodiments be used in the other described embodiment. For instance, when using the first embodiment image sensor package 1' as part of an assembly that will be subjected to extreme environmental conditions, it may be desirable to further seal image sensor package 1' even though it does not contain a high-end image sensing device. Therefore, the backing cap 40 of the second embodiment image sensor package 1" might be included in the first embodiment image sensor package 1' in order to further hermetically seal the device. Under this modification, compression member 46 may not be required on backing cap 40, as image sensor chip 18 would already be secured by encapsulant 32.

The above-illustrated exemplary embodiments of the present invention provide compact leadless packaging for an image sensor or other optically interactive microelectronic device that is simple and economical to fabricate. These image sensor package embodiments are also well suited for a range of environmental conditions, allowing a specific package configuration to be selected based on utility versus cost considerations. Although the present invention has been depicted and described with respect to the illustrated embodiments, various additions, deletions and modifications are contemplated within its scope or essential characteristics. Furthermore, while described in the context of an image sensor package, the invention has utility for the packaging of numerous types of optically interactive microelectronic devices. The scope of the present invention is, therefore, indicated by the appended claims rather than the foregoing description. All changes which come within the meaning and range of equivalency of the claims are to be embraced within their scope.

What is claimed is:

1. A method for assembling an electronic device package comprising:
    forming a package shell having an aperture formed in a first surface thereof and a second-side cavity formed in a second surface thereof and in communication with the aperture, the second-side cavity having an outside perimeter that is larger than an outside perimeter of the aperture to form a cavity first surface in the second-side cavity;
    forming at least one solder pad on at least the second surface of the package shell;
    mounting an optically interactive microelectronic device having an active surface within the second-side cavity such that at least a portion of the active surface is exposed through the aperture and the second surface of the package shell protrudes beyond the optically interactive microelectronic device, wherein mounting an optically interactive microelectronic device comprises:
        forming at least one terminal pad on the cavity first surface that is operably coupled to the at least one solder pad;
        forming at least one conductive element on the active surface of the optically interactive microelectronic device; and
        bonding the at least one conductive element to the at least one terminal pad;
    depositing a transparent encapsulant within the aperture to cover the at least a portion of the active surface exposed therethrough; and
    covering the aperture with a transparent lid.

2. The method of claim 1, further comprising:
    selecting the optically interactive microelectronic device to be an image sensor chip.

3. The method of claim 1, wherein forming a package shell further comprises forming the package shell of a ceramic.

4. The method of claim 1, further comprising:
    forming the transparent lid of glass.

5. The method of claim 1, wherein forming at least one conductive element comprises forming at least one conductive bump on the active surface of the optically interactive microelectronic device.

6. The method of claim 5, further comprising:
    forming the at least one terminal pad and the at least one conductive bump to comprise gold.

7. The method of claim 1, wherein depositing a transparent encapsulant comprises depositing the transparent encapsulant to a level that fills the aperture and covers a portion of the first surface of the package shell surrounding the aperture.

8. The method of claim 7, wherein covering the aperture with a transparent lid comprises:
    lowering the transparent lid onto the first surface of the package shell; and
    holding the transparent lid in place by adhesion to the transparent encapsulant.

9. The method of claim 8, wherein the optically interactive microelectronic device has a plurality of side surfaces, and further comprising:
    squeezing the transparent encapsulant out of a second side of the aperture within the second-side cavity to at least partially encase at least one side surface of the plurality of side surfaces of the optically interactive microelectronic device.

10. The method of claim 9, further comprising:
    leaving a back surface of the optically interactive microelectronic device exposed within the second-side cavity.

11. A method for assembling an electronic device package comprising:
    forming a package shell of a ceramic having an aperture formed in a first surface thereof and a second-side cavity formed in a second surface thereof and in communication with the aperture, the second-side cavity having an outside perimeter that is larger than an outside perimeter of the aperture to form a cavity first surface in the second-side cavity;
    forming a ledge surface in the second surface of the package shell around the second-side cavity;
    forming at least one solder pad on the package shell at least onto the second surface of the package shell;
    covering the aperture with a transparent lid, wherein covering the aperture with a transparent lid comprises integrally forming the transparent lid with the package shell during a ceramic firing process;
    mounting an optically interactive microelectronic device having an active surface within the second-side cavity such that at least a portion of the active surface is exposed through the aperture and the second surface of the package shell protrudes beyond the optically interactive microelectronic device; and covering the second-side cavity with a backing cap.

12. The method of claim 11, wherein covering the aperture with a transparent lid comprises:

forming a depression in the first surface of the package shell; and seating the transparent lid within the depression.

13. The method of claim 11, wherein covering the aperture with a transparent lid comprises hermetically bonding the transparent lid to the package shell with an adhesive material.

14. The method of claim 11, wherein covering the second-side cavity with a backing cap comprises:

hermetically sealing the backing cap to the ledge surface with an adhesive material.

15. The method of claim 11, further comprising forming the backing cap of a ceramic.

16. The method of claim 11, further comprising:

selecting the optically interactive microelectronic device to be an image sensor chip.

17. The method of claim 11, further comprising:

forming the transparent lid of glass.

18. The method of claim 11, wherein covering the second-side cavity with a backing cap comprises:

forming a compression member on the backing cap; and contacting a back surface of the optically interactive microelectronic device with the compression member.

19. The method of claim 18, wherein forming a compression member comprises forming at least one gold trace on the backing cap.

20. A method for assembling an electronic device package comprising:

forming a package shell having an aperture formed in a first surface thereof and a second-side cavity formed in a second surface thereof and in communication with the aperture, the second-side cavity having an outside perimeter that is larger than an outside perimeter of the aperture to form a cavity first surface in the second-side cavity;

forming a ledge surface in the second surface of the package shell around the second-side cavity;

forming at least one solder pad on the package shell at least onto the second surface of the package shell;

covering the aperture with a transparent lid;

mounting an optically interactive microelectronic device having an active surface within the second-side cavity such that at least a portion of the active surface is exposed through the aperture and the second surface of the package shell protrudes beyond the optically interactive microelectronic device, wherein mounting an optically interactive microelectronic device comprises:

forming at least one terminal pad on the cavity first surface that is operably coupled to the at least one solder pad;

forming at least one conductive element on the active surface of the optically interactive microelectronic device; and bonding the at least one conductive element to the at least one terminal pad; and covering the second-side cavity with a backing cap.

21. The method of claim 20, wherein forming at least one conductive element comprises forming at least one conductive bump on the active surface of the optically interactive microelectronic device.

22. The method of claim 21, further comprising:

forming the at least one terminal pad and the at least one conductive bump to comprise gold.

23. A method for assembling an electronic device package comprising:

forming a package shell having an aperture formed in a first surface thereof and a second-side cavity formed in a second surface thereof and in communication with the aperture, the second-side cavity having an outside perimeter that is larger than an outside perimeter of the aperture to form a cavity first surface in the second-side cavity;

forming at least one solder pad on at least the second surface of the package shell;

mounting an optically interactive microelectronic device having an active surface within the second-side cavity such that at least a portion of the active surface is exposed through the aperture;

depositing a transparent encapsulant within the aperture to a level that fills the aperture and covers a portion of the first surface of the package shell surrounding the aperture and covers the at least a portion of the active surface exposed therethrough; and covering the aperture with a transparent lid.

24. The method of claim 23, wherein covering the aperture with a transparent lid comprises:

lowering the transparent lid onto the first surface of the package shell; and holding the transparent lid in place by adhesion to the transparent encapsulant.

25. The method of claim 24, wherein the optically interactive microelectronic device has a plurality of side surfaces, and further comprising:

squeezing the transparent encapsulant out of a second side of the aperture within the second-side cavity to at least partially encase at least one side surface of the plurality of side surfaces of the optically interactive microelectronic device.

26. The method of claim 25, further comprising:

leaving a back surface of the optically interactive microelectronic device exposed within the second-side cavity.

* * * * *

UNITED STATES PATENT AND TRADEMARK OFFICE
CERTIFICATE OF CORRECTION

PATENT NO. : 7,112,471 B2  Page 1 of 1
APPLICATION NO. : 10/693376
DATED : September 26, 2006
INVENTOR(S) : Boon et al.

It is certified that error appears in the above-identified patent and that said Letters Patent is hereby corrected as shown below:

On the face page, in field (54), in "Title", in column 1, line 1, before "LEADLESS" insert -- METHODS OF ASSEMBLING --.

On the face page, in field (54), in "Title", in column 1, line 1, delete "PACKAGING" and insert -- PACKAGES --, therefor.

On the face page, in field (54), in "Title", in column 1, lines 2-3, after "DEVICES" delete "AND METHODS OF ASSEMBLY".

On the face page, in field (56), under "U.S. Patent Documents", in column 2, line 16, delete "B1" and insert -- B2 --, therefor.

In column 1, line 1, before "LEADLESS" insert -- METHODS OF ASSEMBLING --.

In column 1, line 1, delete "PACKAGING" and insert -- PACKAGES --, therefor.

In column 1, lines 2-3, after "DEVICES" delete "AND METHODS OF ASSEMBLY".

Signed and Sealed this

Twenty Second Day of April, 2008

JON W. DUDAS
*Director of the United States Patent and Trademark Office*